(12) United States Patent
Kubota et al.

(10) Patent No.: US 10,811,592 B2
(45) Date of Patent: Oct. 20, 2020

(54) PIEZOELECTRIC ELEMENT, VIBRATOR, VIBRATION WAVE MOTOR, OPTICAL DEVICE, AND ELECTRONIC DEVICE

(71) Applicant: CANON KABUSHIKI KAISHA, Tokyo (JP)

(72) Inventors: Makoto Kubota, Yokohama (JP); Jumpei Hayashi, Yokohama (JP); Tatsuo Furuta, Machida (JP); Kanako Oshima, Tokyo (JP); Shinya Koyama, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 226 days.

(21) Appl. No.: 15/987,282

(22) Filed: May 23, 2018

(65) Prior Publication Data

US 2018/0351074 A1 Dec. 6, 2018

(30) Foreign Application Priority Data

May 30, 2017 (JP) ................................. 2017-107059
May 7, 2018 (JP) ................................. 2018-089410

(51) Int. Cl.
*G02B 7/02* (2006.01)
*H01L 41/187* (2006.01)
(Continued)

(52) U.S. Cl.
CPC ...... *H01L 41/1871* (2013.01); *B41J 2/14233* (2013.01); *B41J 2/14274* (2013.01);
(Continued)

(58) Field of Classification Search
CPC ............. H01L 41/0973; H01L 41/1876; H01L 41/314; H01L 41/43; H01L 41/083;
(Continued)

(56) References Cited

U.S. PATENT DOCUMENTS

| 7,005,776 B1* | 2/2006 | Iino ..................... H01L 41/0913 310/316.01 |
| 2014/0139076 A1* | 5/2014 | Takagaki .............. H01L 41/083 310/365 |
| 2015/0270476 A1* | 9/2015 | Kim .................... H01L 41/0838 310/334 |

FOREIGN PATENT DOCUMENTS

| JP | 2003128460 A | 5/2003 |
| JP | 2007258280 A | 10/2007 |

\* cited by examiner

*Primary Examiner* — Brandi N Thomas
(74) *Attorney, Agent, or Firm* — Canon U.S.A., Inc. IP Division

(57) ABSTRACT

A piezoelectric element, in which a piezoelectric material layer has a plurality of crystal particles and a plurality of void portions and, in at least one of two or more of the piezoelectric material layers, when the average thickness in the lamination direction of the piezoelectric material layer is defined as $T_P$, the average circle-equivalent diameter of the plurality of crystal particles is defined as $D_G$, the maximum length in the lamination direction of the plurality of void portions not contacting the electrode layers is defined as $L_V$, and the average thickness of the electrode layers contacting the at least one piezoelectric material layer is defined as $T_E$, $0.07T_P \leq D_G \leq 0.33T_P$ and $T_E \leq L_V \leq 0.3T_P$ are established and the lead content is less than 1000 ppm.

12 Claims, 8 Drawing Sheets

(51) Int. Cl.
| | |
|---|---|
| H01L 41/047 | (2006.01) |
| H01L 41/083 | (2006.01) |
| H01L 41/273 | (2013.01) |
| B41J 2/14 | (2006.01) |
| H01L 41/257 | (2013.01) |
| H02N 2/10 | (2006.01) |
| G02B 7/09 | (2006.01) |
| G03B 13/36 | (2006.01) |
| H01L 41/293 | (2013.01) |
| G03B 3/10 | (2006.01) |
| H01L 41/27 | (2013.01) |
| G03B 5/00 | (2006.01) |
| G02B 27/64 | (2006.01) |

(52) U.S. Cl.
CPC ............. *G02B 7/09* (2013.01); *G03B 3/10* (2013.01); *G03B 5/00* (2013.01); *G03B 13/36* (2013.01); *H01L 41/0471* (2013.01); *H01L 41/0472* (2013.01); *H01L 41/083* (2013.01); *H01L 41/0838* (2013.01); *H01L 41/257* (2013.01); *H01L 41/27* (2013.01); *H01L 41/273* (2013.01); *H01L 41/293* (2013.01); *H02N 2/103* (2013.01); *B41J 2202/03* (2013.01); *G02B 27/646* (2013.01); *G03B 2205/0061* (2013.01)

(58) Field of Classification Search
CPC ............. H01L 41/1873; H01L 41/318; H01L 41/0805; H01L 41/273; H01L 41/0815; H01L 41/1871; H01L 41/1875; H01L 41/0477; H01L 27/20; H01L 41/0475; H01L 41/338; H01L 41/098; H01L 41/257; H01L 41/27; H01L 41/1878; H01L 41/331; G02B 26/0858; G02B 6/3502; G02B 6/3514; G02B 6/3544; G02B 6/3578; G02B 27/0006; G02B 27/646; G02B 7/09
USPC ............. 359/811, 813, 815, 819–824
See application file for complete search history.

US 10,811,592 B2

PIEZOELECTRIC ELEMENT, VIBRATOR, VIBRATION WAVE MOTOR, OPTICAL DEVICE, AND ELECTRONIC DEVICE

BACKGROUND OF THE INVENTION

Field of the Invention

The present invention relates to a piezoelectric element, a vibrator using the piezoelectric element, a vibration wave motor, an optical device, and an electronic device.

Description of the Related Art

The piezoelectric element has a structure in which piezoelectric material layers and electrode layers are laminated and obtains large deformation and distortion at a low voltage. When an elastic body for controlling the vibration is attached to the piezoelectric element, a laminated piezoelectric vibrator is obtained. The laminated piezoelectric vibrator is usable for various actuators. For example, when a movable body is attached to the laminated piezoelectric vibrator in such a manner that the movable body portion moves by a voltage, a vibration wave motor is obtained.

It is common to use lead zirconate titanate (hereinafter sometimes also referred to as PZT) for the piezoelectric material layer of the piezoelectric element. However, the PZT contains lead as the main component, and therefore the influence on the environment is viewed as problematic, e.g., when discarded, a lead component may melt into the soil, so that the ecosystem may be damaged. Therefore, it has been examined to use a piezoelectric material free from lead, a so-called lead-free piezoelectric material, for the piezoelectric element.

However, Japanese Patent Laid-Open No. 2007-258280 describes that the lead-free piezoelectric material has a disadvantage that the piezoelectric characteristics are lower than those of lead-based piezoelectric ceramics and a sufficiently large displacement cannot be obtained. Then, as one of the solutions therefore, a piezoelectric element containing a potassium niobate-based material is disclosed. However, the firing temperature and the oxygen amount are insufficient, and therefore the piezoelectric constant is still small, and the vibration velocity when the element is used for a laminated piezoelectric vibrator has not been sufficient.

On the other hand, Japanese Patent Laid-Open No. 2003-128460 discloses a technique of increasing the piezoelectric constant converted from the distortion rate by increasing the average particle diameter after firing of a lead-free piezoelectric material to 60.9 µm at the maximum. However, the thickness of the piezoelectric material layer of the piezoelectric element can be reduced to about 20 µm to 70 µm, for example, for the purpose of suppressing the power consumption, and, in addition thereto, it is common to sinter a piezoelectric material layer precursor together with an electrode formation paste in the form of lamination. Therefore, when the sintering temperature is increased and the particle diameter is increased, there has been a disadvantage that the flatness of the piezoelectric material layer has been lost, so that the shape and the thickness of an electrode layer have become nonuniform or the warpage of the entire element and the interlayer peeling have occurred. As a result, there has been a disadvantage that the electrical loss of the piezoelectric element increases and the power consumption has become excessive.

SUMMARY OF THE INVENTION

The present disclosure has been made in order to address the disadvantages of the insufficient vibration velocity and the excessive power consumption. The present invention provides a lead-free piezoelectric element which can be driven with high efficiency.

A piezoelectric element according to one aspect of the present disclosure has a piezoelectric material layer and an electrode layer, in which the piezoelectric material layer and the electrode layer are alternately laminated, in which the piezoelectric material layer has a plurality of crystal particles and a plurality of void portions and the following formulas are satisfied:

$$0.07T_P \leq D_G \leq 0.33T_P \text{ and } T_E \leq L_V \leq 0.3T_P$$

in which, $T_P$ is the average thickness in the lamination direction of the piezoelectric material layer, $D_G$ is the average circle-equivalent diameter of the plurality of crystal particles, $L_V$ is the maximum length in the lamination direction of the plurality of void portions not contacting the electrode layers, and $T_E$ is the average thickness of the electrode layers contacting the at least one piezoelectric material layer and the lead content is less than 1000 ppm.

The present disclosure can provide a lead-free piezoelectric element which can be driven with high efficiency. Moreover, the present disclosure can provide a vibrator, a vibration wave motor, an optical device, and an electronic device which can be driven with high efficiency.

Further features will become apparent from the following description of exemplary embodiments with reference to the attached drawings.

DESCRIPTION OF THE EMBODIMENTS

Piezoelectric Element of Present Disclosure

According to a piezoelectric element of the present disclosure, in a piezoelectric element in which a piezoelectric material layer and an electrode layer are alternately laminated, the piezoelectric material layer has a plurality of crystal particles and a plurality of void portions. The average thickness in the lamination direction of the piezoelectric material layer is defined as $T_P$, the average circle-equivalent diameter of the plurality of crystal particles is defined as $D_G$, the maximum length in the lamination direction of the plurality of void portions not contacting the electrode layers is defined as $L_V$, and the average thickness of the electrode layers contacting the at least one piezoelectric material layer is defined as $T_E$. In that case, $0.07T_P \leq D_G \leq 0.33T_P$ and $T_E \leq L_V \leq 0.3T_P$ are satisfied and the lead content is less than 1000 ppm.

Figure 1A:
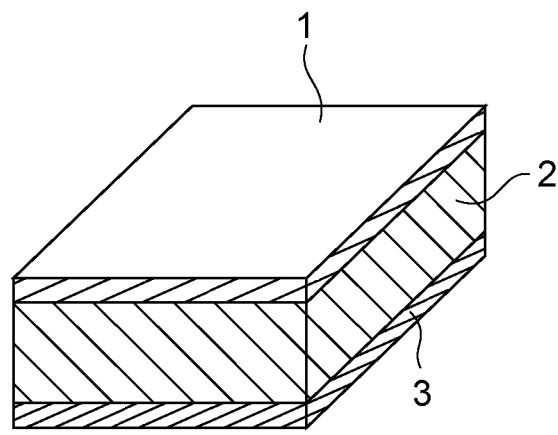
FIGS. 1A to 1C are cross-sectional views and an outside view illustrating one embodiment of the piezoelectric element.

FIG. 1A is a cross-sectional schematic view illustrating one embodiment of the piezoelectric element. The piezoelectric element according has one or more piezoelectric material layers 2 and one or more electrode layers (1 and 3 in FIG. 1A) and the piezoelectric material layers 2 and the electrode layers are alternately laminated.

Figure 1B:
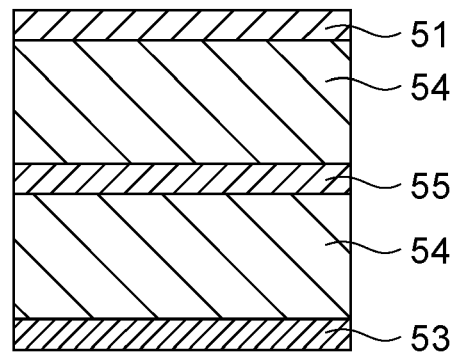

FIG. 1B is a cross-sectional schematic view of the piezoelectric element of in which one or more piezoelectric material layers 54 and one or more electrode layers 55 are alternately laminated and the laminated structure is sandwiched between a first metal electrode 51 and a second metal electrode 53. The piezoelectric element contains the piezoelectric material layer 54 and an electrode layer containing the electrode layer 55, and the layers are alternately laminated. The electrode layers may contain external electrodes, such as the first metal electrode 51 and the second metal electrode 53, in addition to the electrode layer 55.

Figure 1C:
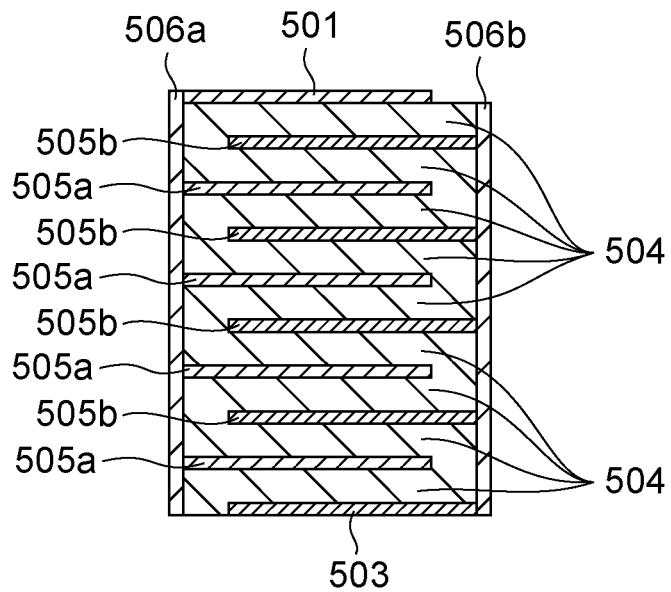

The number of the piezoelectric material layers and the electrode layers may be increased as illustrated in FIG. 1C and the number of the layers is not limited. However, a range of the number of the layers can be 2 layers or more and 60 layers or less as the piezoelectric material layer. Due to the fact that the piezoelectric material layers are two layers or more, an effect of obtaining a large piezoelectric distortion and a high vibration velocity at a low voltage as compared with a case where the piezoelectric material layer is one layer can be expected. On the other hand, due to the fact that the piezoelectric material layers are 60 layers or less, effects of a reduction in the size of the piezoelectric element and a reduction in the electrode cost can be expected.

In the case of the piezoelectric element illustrated in FIG. 1C, nine piezoelectric material layers 504 and eight electrode layers 505 (505a or 505b) are alternately laminated. The laminated structure has a configuration of sandwiching the piezoelectric material layers 504 with a first electrode 501 and a second electrode 503 and has an external short-circuit electrode 506a and an external short-circuit electrode 506b for short-circuiting the electrode layers 505 which are alternately formed. The shape and the arrangement of the electrodes for short-circuiting the electrode layers 505 are not limited to the example of FIG. 1C. The electrode for short-circuiting the electrode layers 505 may be a short-circuit electrode provided in a hole portion (through hole) penetrating the laminated structure besides the use of the external short-circuit electrode. The electrode layers 505 may be short-circuited by not the short-circuit electrode but wiring of a conductive wire and the like.

The size and the shape of the electrode layers 55 and 505 and the external short-circuit electrodes 506a and 506b, the first metal electrodes 51 and 501, and the second metal electrodes 53 and 503 do not necessarily need to be the same as those of the piezoelectric material layers 54 and 504 and may be divided into a plurality of parts.

The thickness of each the electrode layers 55 and 505 and the external short-circuit electrodes 506a and 506b, the first metal electrode 51 and 501, and the second metal electrode 53 and 503 is about 5 nm to 10 μm.

Materials of the electrode layers 55 and 505 and the external short-circuit electrodes 506a and 506b, the first metal electrodes 51 and 501, and the second metal electrodes 53 and 503 are not particularly limited insofar as the materials are conductive metals and, for example, metal simple substances, such as Ti, Pt, Ta, Ir, Sr, In, Sn, Au, Al, Fe, Cr, Ni, Pd, Ag, and Cu, an alloy thereof, and a laminate thereof are mentioned. Moreover, the electrodes may contain different materials.

In the processability in manufacturing, the conductivity and the shape uniformity as the electrode layer, and the cost, the materials of the electrode layers 55 and 505 can contain Ag and Pd, which are the main components, e.g., Ag and Pd occupy 90% by weight or more and 100% by weight or less of the electrode layer in total, for example. A weight ratio M1/M2 of a content weight M1 of the Ag and a content weight M2 of the Pd is preferably $0.25 \leq M1/M2 \leq 4.0$. The weight ratio is more preferably $0.3 \leq M1/M2 \leq 3.0$. When the weight ratio M1/M2 is less than 0.25, the sintering temperature of the electrode layer becomes high, and thus the weight ratio is not suitable. On the other hand, when the weight ratio M1/M2 becomes larger than 4.0, the electrode layer is formed into an island shape, and therefor is nonuniform in the plane, and therefore the weight ratio is not suitable. The weight ratio is more preferably $0.3 \leq M1/M2 \leq 3.0$.

A lead component contained in the piezoelectric element is less than 1000 ppm. The lead content is more preferably 500 ppm or less. A method for quantifying the lead component contained in the piezoelectric element is not particularly limited and, for example, X-ray Fluorescence Analysis (XRF), ICP optical emission spectroscopy, atomic absorption analysis, or the like is mentioned. Among the above, the ICP optical emission spectroscopy is suitable for quantifying a trace amount of the lead component.

When the lead content in the piezoelectric element is less than 1000 ppm or less, the influence by the lead in products containing the piezoelectric element on the natural environment or living bodies is reduced even when the products are discarded and are exposed to various severe environments. The lead component contained in the piezoelectric material layer in which the lead component is difficult to separate in recycling among members configuring the piezoelectric element is more preferably less than 1000 ppm. Also in a laminated piezoelectric vibrator, a vibration wave motor, an optical device, and an electronic device containing the piezoelectric element, the lead component in the entire constituent member is preferably less than 1000 ppm. A method for quantifying the lead component in the laminated piezoelectric vibrator, the vibration wave motor, the optical device, and the electronic device is the same as the method for the piezoelectric element.

Figure 2A:
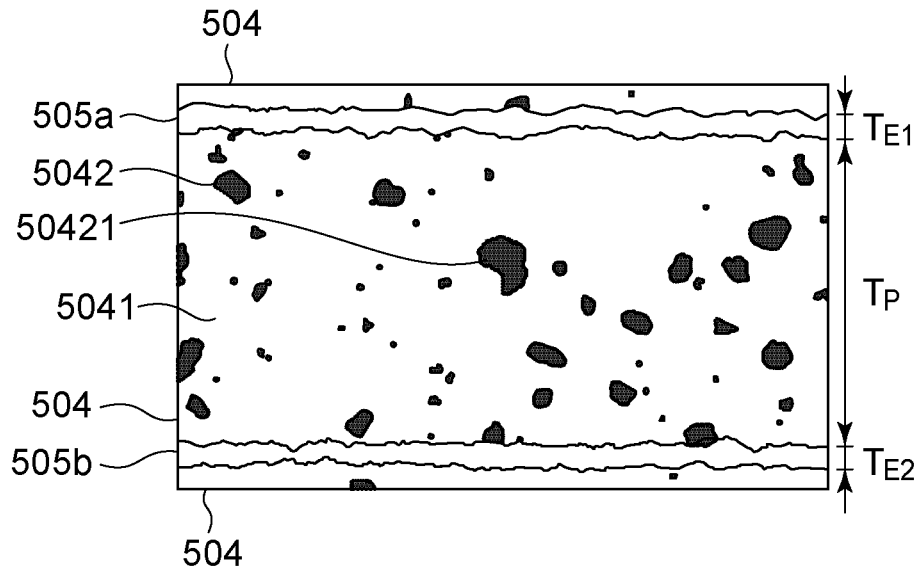
FIGS. 2A to 2C are cross-sectional schematic views illustrating an example of an embodiment of piezoelectric material layers and electrode layers of the piezoelectric element.

FIG. 2A is a cross-sectional schematic view illustrating an example of an embodiment of the piezoelectric material layers and the electrode layers of the piezoelectric element. As illustrated in the figure, the piezoelectric material layers 504 and the electrode layers 505a and 505b are alternately laminated. FIG. 2A is an image of the observation visual field in which the piezoelectric element of FIGS. 1A, 1B, and 1C is partially enlarged and does not illustrate the piezoelectric material layers 504 continuous in the upper and lower sides of the figure and the piezoelectric material layers 504 and the electrode layers 505a and 505b continuous in the right and left sides of the figure.

The piezoelectric material layer 504 contains an aggregate 5041 (white painted portion in the figure and the grain boundary of each crystal particles is omitted) of a plurality of crystal particles and aggregates of a plurality of void portions 5042. The void portions 5042 include the void portions 5042 contacting the electrode layers 505a and 505b (hereinafter referred to as an electrode adjacent void portion) and the void portions 5042 not contacting the electrode layers 505a and 505b (hereinafter referred to as an electrode independent void portion). All the void portions 5042 produce an effect of planarizing an interface portion where the piezoelectric material layer 504 contacts the electrode layers 505a and 505b to reduce the dielectric loss tangent of the piezoelectric element but the electrode adjacent void portions inhibit the electrical contact of the piezoelectric material layer 504 and the electrode layers 505a and 505b, and therefore the number of the electrode adjacent void portions is suitably small. For example, the ratio of a number $N_{V1}$ of the electrode adjacent void portions to a number $N_{V2}$ of the electrode independent void portions in the cross-sectional observation visual field of the piezoelectric element suitably satisfy the relationship of $N_{V2}/N_{V1} \geq 3$.

A ratio $P_V$ in which an area $S_V$ occupied by the void portions in the cross-sectional observation visual field of the piezoelectric element occupies an area $S_P$ of the piezoelectric material layer is preferably 3% by area or more and 10% by area or less. Due to the fact that the $P_V$ is 3% by area or more and 10% by area or less, the dielectric loss tangent can be suppressed without inhibiting the vibration of the piezoelectric element. When the $P_V$ is smaller than 3% by area, there is a possibility that the interface flatness of the piezoelectric material layer and the electrode layer is impaired, so that the dielectric loss tangent of the piezoelectric element may increase. On the other hand, when the $P_V$ is larger than 10% by area, there is a possibility that the void portions absorb a part of the deformation of the piezoelectric material layer, and thus the piezoelectric element or the laminated piezoelectric vibrator containing the piezoelectric element may not be able to exhibit a desired vibration velocity and torque.

In the calculation of the $N_{V1}$, the $N_{V2}$, the $S_V$, the $S_P$, and the $P_V$, it is difficult to observe all the parts of the piezoelectric element at once at a high magnification, in fact. Then, the cross section of the piezoelectric element is observed at a magnification of about 100 to 500 with a scanning electron microscope (SEM) to obtain typical observation images of about five parts or more for each piezoelectric material layer, whereby the parameters described above can be calculated and the large/small relationship thereof can be determined.

The thickness in the lamination direction of the piezoelectric material layer 504 to be observed is defined as $T_P$. The $T_P$ may be the average thickness in one piezoelectric material layer 504 and may be a different thickness for each piezoelectric material layer. The $T_P$ of an arbitrary piezoelectric material layer can be calculated by performing image processing of the cross-sectional observation image by SEM. It is common in the piezoelectric element that the thickness in the same piezoelectric material layer hardly varies depending on parts. Therefore, the $T_P$ value may be calculated from a typical SEM image of one part but it is more desirable to obtain SEM images of five parts or more for the same piezoelectric material layer, and then use the average $T_P$ value.

Although the size of the $T_P$ is not particularly limited and is preferably 20 μm or more and 70 μm or less in the viewpoint of the design and the manufacturing of the piezoelectric element. When the $T_P$ is less than 20 μm, it is necessary to increase the number of the layers in order to increase the admittance of the piezoelectric element. As a result, the number of the electrode layer increases, and thus there is a possibility that the cost of the electrode layers may increase. On the other hand, when the thickness of the $T_P$ is larger than 70 μm, a voltage required for the piezoelectric element to obtain large displacement increases. As a result, there is a possibility that the cost of the power supply may increase.

Figure 2B:
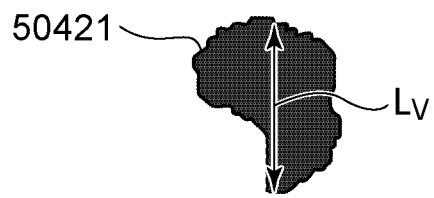

The maximum length in the lamination direction of the void portion not contacting the electrode layers among the void portion 5042, i.e., the void portion (electrode independent void portion) present in a part surrounded by the crystal particles, is defined as $L_V$. In the case of FIG. 2A, the void portion longest in the lamination direction is a void portion 50421, and therefore the length in the lamination direction of the void portion 50421 is defined as the $L_V$. Since it is difficult to determine the maximum length only by one narrow observation visual field, it is desirable to observe the entire region sandwiched between the electrode layers and observed for determining the average thickness $T_P$ for the same piezoelectric material layer to determine the maximum length $L_V$. The length in the lamination direction of the void portion can be easily calculated by performing image processing of the cross-sectional observation image by SEM. FIG. 2B is an enlarged view of the void portion 50241. The maximum length of the line segment inscribed in a direction perpendicular to the electrode layers with respect to the cross-sectional outer periphery of the void portion is the $L_V$.

The average thickness of the electrode layers contacting at least one piezoelectric material layer 504 to be observed is defined as $T_E$. Specifically, when the average thickness of the electrode layer 505a is defined as $T_{E1}$ and the average thickness of the electrode layer 505b is defined as $T_{E2}$, $T_E = (T_{E1} + T_{E2})/2$ is established. The length in the lamination direction of the electrode layers can be easily calculated by performing image processing of the cross-sectional observation image by SEM.

The size of the $T_E$ is not particularly limited and the $T_E$ is preferably 3.5 μm or more and 10 μm or less. Due to the fact that the $T_E$ of the electrode layers is 3.5 μm or more, the conductivity of the electrode layer increases, and thus a desired voltage can be efficiently applied to the piezoelectric material layers 54 and 504. On the other hand, due to the fact that the $T_E$ of the electrode layers is 10 μm or less, the size reduction and the cost reduction of the piezoelectric element can be achieved while sufficiently maintaining the vibration performance of the piezoelectric element.

Figure 2C:
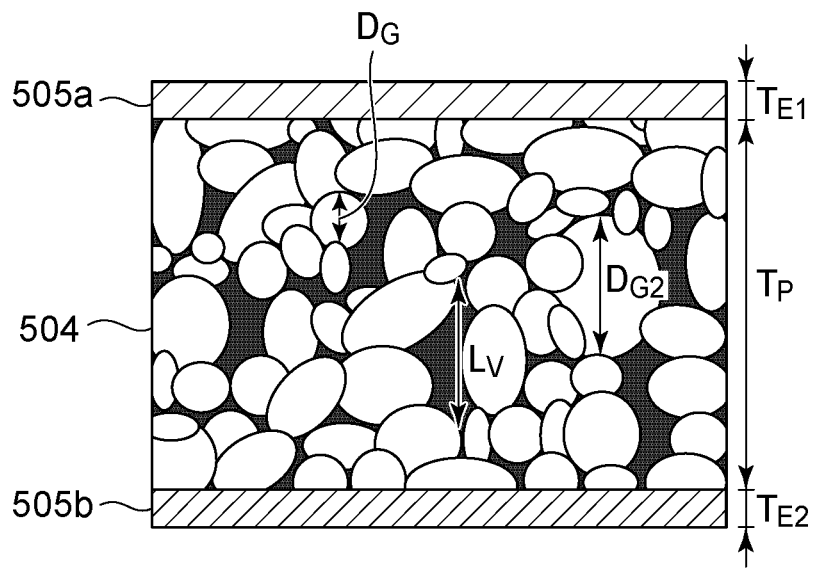

FIG. 2C is a cross-sectional schematic view illustrating an example of an embodiment of the piezoelectric material layer 504 and the electrode layers 505a and 505b of the piezoelectric element and schematically represent an aggregate of crystal particles (No reference numerals, white painted portion in the figure) and an aggregate of the void portions (No reference numerals, Black painted portion in the figure) configuring the piezoelectric material layer 504.

When N crystal particles are present in the same piezoelectric material layer, the circle-equivalent diameter of the n-th metal oxide is defined as $D_{Gn}$. The "circle-equivalent diameter" indicates the "projected area circle-equivalent diameter" generally referred to in a microscopic observation method and indicates the diameter of a perfect circle having the same area as the projected area of the crystal particles. A method for measuring the circle-equivalent diameter is not particularly limited and the circle-equivalent diameter can be determined by performing image processing of a photograph image obtained by photographing the cross section of the piezoelectric element by SEM. The average value of the circle-equivalent diameters of the N crystal particles in the same piezoelectric material layer is defined as the average circle-equivalent diameter $D_G$.

It is difficult to calculate the circle-equivalent diameter of all the crystal particles in one piezoelectric material layer.

Inside the piezoelectric material layer, the circle-equivalent diameter in the lamination direction equivalent to the vertical direction of FIG. 2C varies but hardly varies in the plane direction equivalent to the lateral direction. Therefore, an SEM image in which the thickness $T_P$ in the lamination direction of one piezoelectric material layer 504 is entirely included in a visual field as illustrated in FIG. 2C is obtained, and then the circle-equivalent diameters of the crystal particles in the visual field are averaged, whereby a sufficiently credible $D_G$ value is obtained. For example, it is enough to calculate the average circle-equivalent diameter $D_G$ of 100 or more crystal particles throughout the lamination direction of the piezoelectric material layers.

The size of the average circle-equivalent diameter $D_G$ is not particularly limited and the $D_G$ is preferably 5 μm or more and 15 μm or less. By setting the average circle-equivalent diameter $D_G$ of the crystal particles configuring the piezoelectric material layer within the range above, the piezoelectric material layer has a high piezoelectric constant. When the $D_G$ is less than 5 μm, the piezoelectric constant is not sufficient as compared with a case where the $D_G$ is 5 μm or more and 15 μm or less, and, as a result, the vibration velocity of the piezoelectric element is insufficient in some cases.

As a piezoelectric constant $d_{33}$ of the piezoelectric material layer, the $d_{33}$ can be approximately calculated by measuring an apparent piezoelectric constant $d_{33}^{*sum}$ of the entire piezoelectric element, and then dividing the $d_{33}^{*sum}$ by the number of the piezoelectric material layers, for example. The apparent piezoelectric constant $d_{33}^{*sum}$ of the entire piezoelectric element is measurable using a commercially-available $d_{33}$ meter, for example. When the $d_{33}$ meter is used, the dielectric loss tangent of the piezoelectric element is also simultaneously measurable. The dielectric loss tangent of the piezoelectric element and the dielectric loss tangent of the piezoelectric material layer may be regarded to be equivalent to each other. In usual, the piezoelectric constant $d_{33}^{*sum}$ or the dielectric loss tangent may be measured at room temperature, for example, 25° C., and then the $d_{33}$ and the dielectric loss tangent of the piezoelectric material layer may be calculated.

On the other hand, when the $D_G$ exceeds 15 μm, it may be difficult for the crystal particles to densely fill the piezoelectric material layer of the thickness $T_P$ of, for example, about 20 to 70 μm as compared with a case where the $D_G$ is 5 μm or more and 15 μm or less. The ratio of the void portions is as high as 20% by area or more to the region of the piezoelectric material layer of the cross-sectional image, for example, in some cases. As a result, the mechanical strength or the dielectric loss tangent of the piezoelectric material layer may be impaired. In any case, a user of the piezoelectric element may arbitrarily determine the size of the average circle-equivalent diameter $D_G$ according to the intended use.

The circle-equivalent diameter $D_{Gn}$ of each of the crystal particles is preferably $D_{Gn} \leq 20$ μm. When crystal particles having a circle-equivalent diameter $D_{Gn}$ exceeding 20 μm are present, the mechanical strength or the dielectric loss tangent of the piezoelectric material layer may be impaired.

The piezoelectric element has at least one or more of piezoelectric material layers satisfying $0.07T_P \leq D_G \leq 0.33T_P$ and $T_E \leq L_V \leq 0.3T_P$. It is more suitable that all the piezoelectric material layers which contribute to the piezoelectric vibration of the piezoelectric element satisfy the relationship of $0.07T_P \leq D_G \leq 0.33T_P$ and $T_E \leq L_V \leq 0.3T_P$.

In the piezoelectric element, due to the fact that the average circle-equivalent diameter $D_G$ of the crystal particles is 0.07 times or more the thickness $T_P$ in the lamination direction of the piezoelectric material layer, the piezoelectric constant of the piezoelectric material layer increases. For example, when a barium titanate based material is used for the piezoelectric material layer, the piezoelectric constant is as high as $d_{33} \geq 160$ pm/V. On the other hand, when the $D_G$ is smaller than $0.07T_P$, the piezoelectric constant of the piezoelectric material layer decreases, so that a sufficient vibration velocity is not obtained. For example, when a barium titanate based material is used for the piezoelectric material layer, the piezoelectric constant is as low as $d_{33} \leq 100$ pm/V.

Due to the fact that the $D_G$ is 0.33 times or less the $T_P$, it can be expected that three or more crystal particles accumulate in the lamination direction of the piezoelectric material layers, and thus the mechanical strength of the piezoelectric material layer is sufficiently obtained and the dielectric loss tangent of the piezoelectric material layer sufficiently decreases. On the other hand, when the $D_G$ is higher than $0.33T_P$, the ratio of the grain boundary, i.e., void portions, increases, and, as a result, the mechanical strength or the dielectric loss tangent of the piezoelectric material layer is impaired.

Due to the fact that the maximum length $L_V$ in the lamination direction of the void portion is larger than the average thickness $T_E$ of the electrode layers contacting the piezoelectric material layer, the plurality of void portions buffer parts with imperfect crystal particle filling property in the piezoelectric material layer. As a result, the flatness of the interface between the electrode layers and the piezoelectric material layer is improved. Therefore, the electric field application to the piezoelectric material from the metal electrode becomes uniform and the dielectric loss tangent as the piezoelectric element decreases.

When the crystal particles press the electrode layers due to the growth or the movement of the crystal particles, so that the electrode layers are deformed corresponding to the layer thickness or more, there is a possibility that the electrode layers may be ruptured. The fact that the $L_V$ is larger than the $T_E$ means that the void portions can buffer the deformation equivalent to the layer thickness of the electrode layers. Since the $L_V$ is the maximum length in the lamination direction of the void portion, a large number of smaller void portions are present inside the piezoelectric material layer. The small void portions are traces that the large void portions accept the growth or the movement of the crystal particles in order to suppress the deformation of the electrode layers.

However, the void portion is a portion which does not contribute to the vibration of the element by the piezoelectric effect, and therefore the size thereof has the upper limit. The upper limit of the $L_V$ is 0.3 times the thickness $T_P$ in the lamination direction of the piezoelectric material layer, i.e., $L_V \leq 0.3T_P$. When the $L_V$ is larger than $0.3T_P$, the void portion inhibits the vibration of the element by the piezoelectric effect when an electric field is applied to the piezoelectric element.

In the piezoelectric material layer satisfying $0.07T_P \leq D_G \leq 0.33T_P$ and $T_E \leq L_V \leq 0.3T_P$, the line average roughness Ra when the interface between the piezoelectric material layer and an electrode layer adjacent thereto is observed from the cross section is preferably 1 μm or less. The line average roughness Ra in this specification is equivalent to the arithmetic average roughness Ra of the contour curve described in JIS B 0601. For example, the line average roughness Ra can be calculated by performing image processing of a cross-sectional observation image by SEM to clarify the contour of an interface portion between the electrode layers and the piezoelectric material layers as illustrated in FIG. 2A, integrating variation values in the lamination direction (longitudinal direction in the figure) in the line segment direction, and then averaging the obtained values by the line segment length. When the Ra of the portion is 1 μm or less, the parallelism of the two electrode layers sandwiching the piezoelectric material layer increases, so that an electric field can be perpendicularly applied to the piezoelectric material layer. Therefore, the vibration efficiency of the piezoelectric element increases and the power consumption decreases. When the Ra is 0.6 μm or less, the power consumption of the piezoelectric element further decreases. The ideal Ra is 0 (zero) but the minimum value of the Ra which can be actually manufactured is about 0.05 μm.

A metal oxide configuring the piezoelectric material layer can be a barium titanate-based metal oxide. A barium titanate-based material is advantageous in that a high piezoelectric constant is exhibited without using a lead component and that the dielectric loss tangent can be reduced with a trace amount of additives.

Herein, the barium titanate-based material refers to compositions, such as barium titanate ($BaTiO_3$), barium titanate calcium $(Ba,Ca)TiO_3$), barium zirconate titanate $(Ba(Ti,Zr)O_3)$, barium zirconate titanate calcium $(Ba,Ca)(Ti,Zr)O_3$, sodium niobate-barium titanate ($NaNbO_3$—$BaTiO_3$), bismuth sodium titanate-barium titanate $(Bi,Na)TiO_3$—$BaTiO_3$), bismuth potassium titanate-barium titanate $((Bi,K)TiO_3$—$BaTiO_3$), barium titanate-bismuth ferrite ($BaTiO_3$—$BiFeO_3$), and the like, and materials containing the compositions as the main component.

Among the exemplary materials, the barium titanate-based material can be an oxide containing Ba, Ca, Ti, and Zr in the viewpoint that both the piezoelectric constant and the temperature stability of the piezoelectric material layer can be achieved. When the piezoelectric constant of the piezoelectric material layer increases, the admittance of the piezoelectric element increases, so that large displacement can be obtained. Moreover, when the temperature stability of the piezoelectric constant of the piezoelectric material layer is high, the vibration velocity or the power consumption of the piezoelectric element depending on the operating temperature is stabilized.

An x value which is the molar ratio of Ca to the total of Ba and Ca in the oxide containing Ba, Ca, Ti, and Zr mentioned above is preferably $0.02 \leq x \leq 0.30$.

The X value is more preferably $0.10 \leq x \leq 0.20$.

Due to the fact that the x is 0.10 or more, the phase transition temperature of the tetragonal structure and the rhombohedral structure of the barium titanate-based material shifts to a low temperature, the vibration velocity and the power consumption in the operating temperature range, for example, 0° C. to 50° C., of the piezoelectric element are particularly stabilized. On the other hand, due to the fact that the x is 0.20 or less, the piezoelectric constant of the piezoelectric material layer can be kept particularly high and the vibration velocity and the torque required in the piezoelectric element can be obtained.

In the oxide containing Ba, Ca, Ti, and Zr mentioned above, a y value which is the molar ratio of Zr to the total of Ti and Zr is preferably $0.01 \leq y \leq 0.09$.

The y value is more preferably $0.02 \leq y \leq 0.07$.

Due to the fact that the y is 0.02 or more, the piezoelectric constant of the piezoelectric material layer particularly increases and the vibration velocity and the torque required in the piezoelectric element can obtained. On the other hand, due to the fact that the y is 0.07 or less, the curie temperature of the piezoelectric material layer can be particularly kept at 100° C. or more.

The piezoelectric material layer contains a Mn component together with the oxide containing Ba, Ca, Ti, and Zr mentioned above. The Mn content is preferably 0.02 part by weight or more and 0.40 part by weight or less in terms of metal based on 100 parts by weight of the oxide containing Ba, Ca, Ti, and Zr mentioned above.

The Mn content is more preferably 0.04 part by weight or more and 0.40 part by weight or less and the Mn content range is still more preferably 0.08 part by weight or more and 0.30 part by weight.

The Mn content "in terms of metal" is obtained by calculating the elements configuring the metal oxide in terms of oxide from the content of each metal in measuring the piezoelectric material by X-ray Fluorescence Analysis (XRF), ICP optical emission spectroscopy, atomic absorption analysis, or the like. When the total weight is set to 100, the Mn content is given by a ratio of the total weight to the weight of the Mn metal. In the calculation in terms of oxide, the crystal structure is specified (for example, perovskite structure) beforehand through an X-ray diffraction experiment or the like, and then the number of oxygen is calculated based on the specified crystal structure and the analysis result of the metal content. In the case of a perovskite structure oxide, the structure is generally expressed by the composition formula $ABO_3$. However, the calculated number of oxygen may deviate by several percent from the viewpoint of charge balance and the like.

When the oxide containing Ba, Ca, Ti, and Zr mentioned above contains Mn in the range above, the electrical insulation properties of the piezoelectric element are improved and the dielectric loss tangent decreases. As a result, the power consumption of the piezoelectric element decreases, and thus the Mn content is suitable. When the Mn content is less than 0.04 part by weight, an improvement effect of the dielectric loss tangent cannot be expected as compared with an oxide free from Mn in some cases. On the other hand, when the Mn content is larger than 0.40 part by weight, the piezoelectric constant decreases as compared with an oxide free from Mn in some cases. A user can adopt a desired content according to the intended use.

When the piezoelectric constants $d_{33}$ at room temperature of the piezoelectric material layers configuring the piezoelectric element satisfy $d_{33} \geq 160$ pm/V, sufficient vibration velocity and torque can be obtained when the piezoelectric element is applied to a vibrator or a vibration wave motor.

When the dielectric loss tangents at room temperature of the piezoelectric element and the piezoelectric material layer configuring the piezoelectric element are 0.8% or less in the range of 100 to 1000 Hz, an adverse effect on the power consumption of the piezoelectric element is a negligible level.

Method for Manufacturing Piezoelectric Element

A method for manufacturing a piezoelectric element is not particularly limited and a manufacturing method when a barium titanate-based material is used for a metal oxide configuring a piezoelectric material layer is described below as an example.

First, a solvent is added to a powdered barium titanate-based material to obtain slurry.

In order to prevent the warpage of a laminated element and the occurrence of cracks in the subsequent firing process, a so-called calcined powder obtained by calcining an oxide containing Ba, Ca, Ti, and Zr components beforehand at a temperature of about 800 to 1100° C. can be used for the powdered barium titanate-based material. Calcined powder may be obtained by adding a Mn oxide to the oxide, followed by calcining. The mixture ratio of Ba, Ca, Ti, Zr, and Mn components contained in the calcined powder is the same as that of a target metal oxide.

An assistant is added to the calcined powder for the purpose of the formation of void portions after firing. It is suitable for the assistant to contain particulate $SiO_2$, $B_2O_3$, $Al_2O_3$, and $Na_2CO_3$ because the start temperature of the shrinkage accompanying the particle growth in the firing decreases and the void portions are generated inside the piezoelectric material layer. An average particle diameter of the particulate $SiO_2$, $B_2O_3$, $Al_2O_3$, and $Na_2CO_3$ can be 0.5 µm or more and 2.0 µm or less.

In order to promote the generation of the void portions inside the piezoelectric material layer, hollow particles may be compounded in the assistant. As a raw material of the particles, a raw material which does not affect the piezoelectric characteristics after firing is suitable and, for example, $SiO_2$ and organic high molecular weight polymers are usable.

The addition ratio of the assistant to the calcined powder is preferably 0.05 part by weight or more and 1.0 part by weight or less. By setting the addition ratio of the assistant in the range above, the void portions can be formed inside the piezoelectric material layer without impairing the vibration velocity of the piezoelectric element.

As the solvent to be added to the powdered barium titanate-based material, toluene, ethanol, or a mixed solvent of toluene and ethanol, n-butyl acetate, and water are usable, for example. The amount of the solvent is a weight 1.0 to 2.0 times the weight of metallic compound powder, for example. The solvent is added to the metallic compound powder and mixed in a ball mill for 24 hours, and then a binder and a plasticizer are added. As the binder, PVA (polyvinyl alcohol), PVB (polyvinyl butyral), acrylic resin, and the like are usable, for example. When the PVB is used for the binder, the PVB is weighed so that the weight ratio of the solvent to the PVB is 88:12, for example. As the plasticizer, dioctyl sebacate, dioctyl phthalate, and dibutyl phthalate are usable, for example. When the dibutyl phthalate is used for the plasticizer, the dibutyl phthalate of the same weight as the weight of the binder is added.

After adding the binder and the plasticizer, the mixing in the ball mill is performed again overnight. The target viscosity of the slurry is 300 to 500 mPa·s and the amount of the solvent or the binder may be increased/reduced for the adjustment of the viscosity.

Next, the slurry is applied onto a base material to obtain a green sheet which is a piezoelectric material layer precursor.

The green sheet is obtained by applying the slurry onto the base material using a doctor blade, followed by drying. As the base material, a fluorine coated PET film is usable, for example. The green sheet thickness is not particularly limited and can be adjusted according to the thickness of a target piezoelectric material layer. The green sheet thickness can be increased when the viscosity of the slurry is increased.

Next, an electrode layer is formed on the green sheet.

A small hole serving as a through hole is formed as necessary in the green sheet. Furthermore, a paste containing a conductive powder material serving as a short-circuit electrode is charged into the hole formed in the green sheet by a screen printing method. Furthermore, a paste containing a conductive powder material forming an electrode layer is printed to the surface of the green sheet by a screen printing method.

Two or more of the green sheets are sequentially laminated from the bottom as illustrated in FIG. 1, and then pressurized under heating by a heating pressurizing device for lamination to form a laminate before firing.

Then, the laminate is fired under the air atmosphere of 1150° C. to 1350° C. Next, a poling procedure is performed to the fired body after the firing. The conditions of the poling procedure can be varied according to the composition and the structure of the piezoelectric material layer. For example, heating may be performed to 60 to 150° C., and then an electric field of about 1 kV/mm to 2 kV/mm may be applied for about 10 to 60 minutes.

Vibrator of Present Disclosure

The vibrator has a piezoelectric element, a first elastic body and a second elastic body holding the piezoelectric element therebetween, a shaft penetrating the piezoelectric element, the first elastic body, and the second elastic body, and a nut provided in the shaft.

Figure 3:
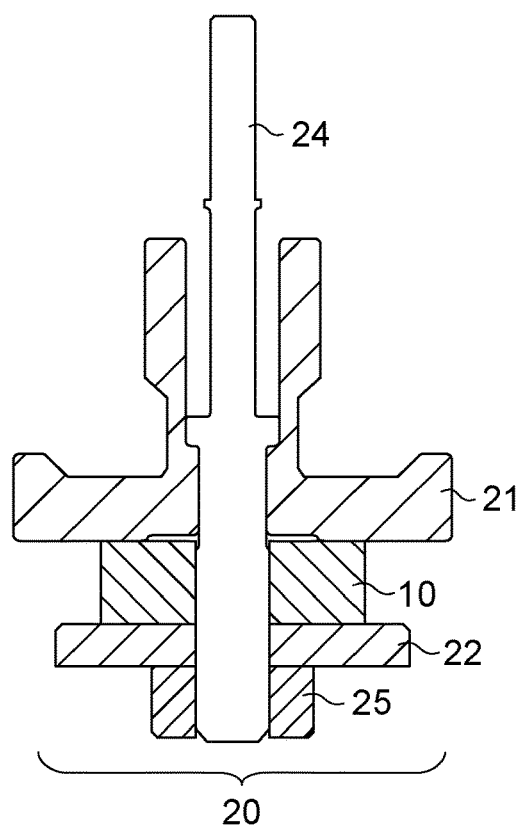
FIG. 3 is a cross-sectional view of the outline structure illustrating one embodiment of a vibrator.

FIG. 3 is a cross-sectional view of the outline structure illustrating one embodiment of the vibrator.

As illustrated in FIG. 3, a piezoelectric element 10 is held between a first elastic body 21 and a second elastic body 22 in the lamination direction of the piezoelectric element 10. Furthermore, the piezoelectric element 10 has a shaft 24 and a first nut 25.

The first elastic body 21 and the second elastic body 22 each have a hole portion for passing the shaft 24.

The shaft 24 penetrates the piezoelectric element 10, the first elastic body 21, and the second elastic body 22.

Furthermore, the first nut 25 is attached to the shaft 24. Raw materials of the first elastic body 21, the second elastic body 22, the shaft 24, and the first nut 25 are not particularly limited and the first elastic body 21, the second elastic body 22, the shaft 24, and the first nut 25 can contain metals from the viewpoint of the elastic modulus and a SUS material and brass are mentioned, for example.

The piezoelectric element 10 is bonded to the first elastic body 21 and the second elastic body 22 using an adhesive or the like in parts of the first electrode and the second electrode. The bonding can be performed while giving a pressure of about 1 MPa to 10 MPa. The piezoelectric element 10 is fastened with the shaft 24 and the first nut 25 and predetermined compressive force is given. Due to the fact that the compressive force is given to the piezoelectric element 10, the destruction of the piezoelectric element 10 when the laminated piezoelectric vibrator vibrates by large displacement can be prevented.

Vibration Wave Motor of Present Disclosure

A vibration wave motor has the above-described vibrator and a movable body contacting the first elastic body 21 of the vibrator.

Figure 4:
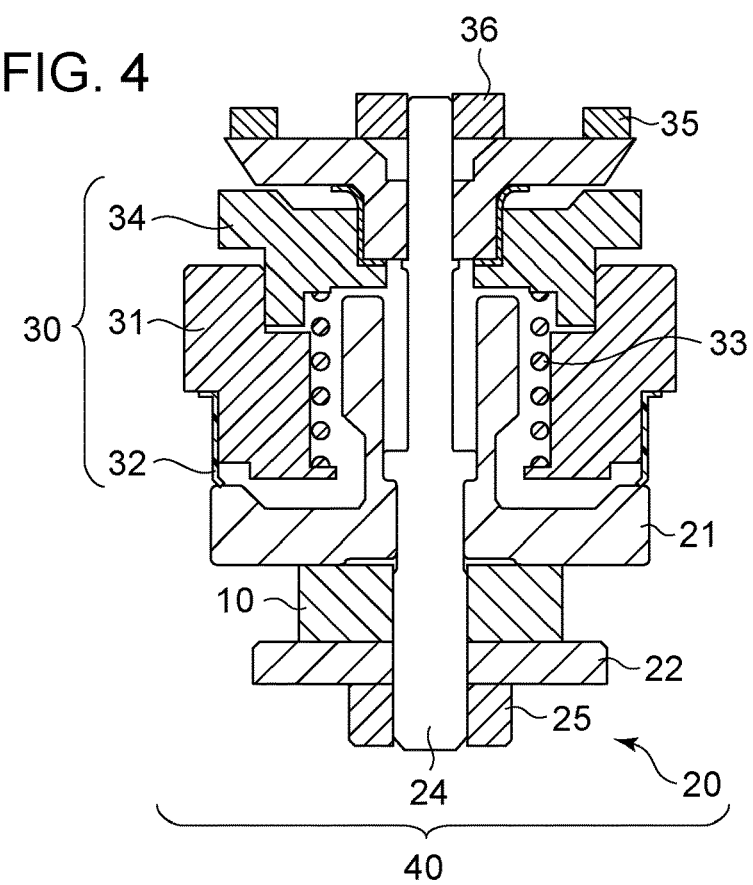
FIG. 4 is a cross-sectional view of the outline structure illustrating one embodiment of a vibration wave motor.

FIG. 4 is a cross-sectional view of the outline structure illustrating one embodiment of the vibration wave motor.

A vibration wave motor 40 has a movable body 30 in addition to the piezoelectric element 10, the first elastic body 21, the second elastic body 22, the shaft 24, and the first nut 25 configuring the vibrator 20. Furthermore, the vibration wave motor 40 may have a flange 35 for attaching the vibration wave motor 40 to a device and a second nut 36 for pressing the movable body 30 against the vibrator 20 as necessary. The flange 35 is a member for attaching the vibration wave motor 40 to an external member which is not illustrated, such as a frame, of a device in which the vibration wave motor 40 is mounted and is fixed to a predetermined position with the second nut 36.

The configuration of the movable body 30 is not particularly limited and the movable body 30 has a rotor 31 for converting the vibration of the piezoelectric element into the rotational movement as the principal member in a general configuration illustrated in FIG. 4. Furthermore, the movable body 30 may have a sliding member 32 for preventing an unusual sound in vibration, a pressurization spring 33 for giving frictional force to the contact surface of the first elastic body 21 and the movable body 30, and a gear 34 for transmitting power as necessary as illustrated in the figure.

A raw material of the sliding member 32 can be resin, such as natural rubber or synthetic rubber. Raw materials of the rotor 31, the pressurization spring 33, the gear 34, the flange 35, and the second nut 36 can be metal materials and, for example, an SUS material, brass, and the like are used.

In the vibration wave motor 40, the first elastic body 21 of the vibrator 20 which is a constituent member is in contact with the movable body 27 (sliding member 32 in the figure). When the first elastic body 21 and the movable body 27 are in contact with each other, the vibration generated by applying a voltage to the vibrator 20 can be efficiently transmitted to the movable body 27.

A lower end of the sliding member 32 contacts the upper surface of the first elastic body 21. The rotor 31 is fixed to the sliding member 32. The gear 34 is disposed above the rotor 31 and a recessed portion provided in the upper side the rotor 31 and a projection portion provided in the lower side of the gear 34 are engaged with each other. The pressurization spring 33 is disposed between the rotor 31 and the gear 34. By the spring force of the pressurization spring 33, the position of the gear 34 is determined and the rotor 31 is pressurized downward. Thus, the lower end surface of the sliding member 32 fixed to the rotor 31 is pressed against the upper surface of the first elastic body 21 to be brought into a pressure contact with each other, and therefore predetermined frictional force arises on the contact surface.

When a voltage is applied to the piezoelectric element 10, bending vibration arises in the vibrator 20, so that the sliding member 32, the rotor 31, the gear 34, and the pressurization spring 33 configuring the movable body 30 integrally rotate around the axis of the shaft 24. A rotation output can be extracted from any one of the sliding member 32, the rotor 31, and the gear 34.

Optical Device of Present Disclosure

An optical device has the vibration wave motor 40 and an optical member dynamically connected to the vibration wave motor 40.

Figure 5:
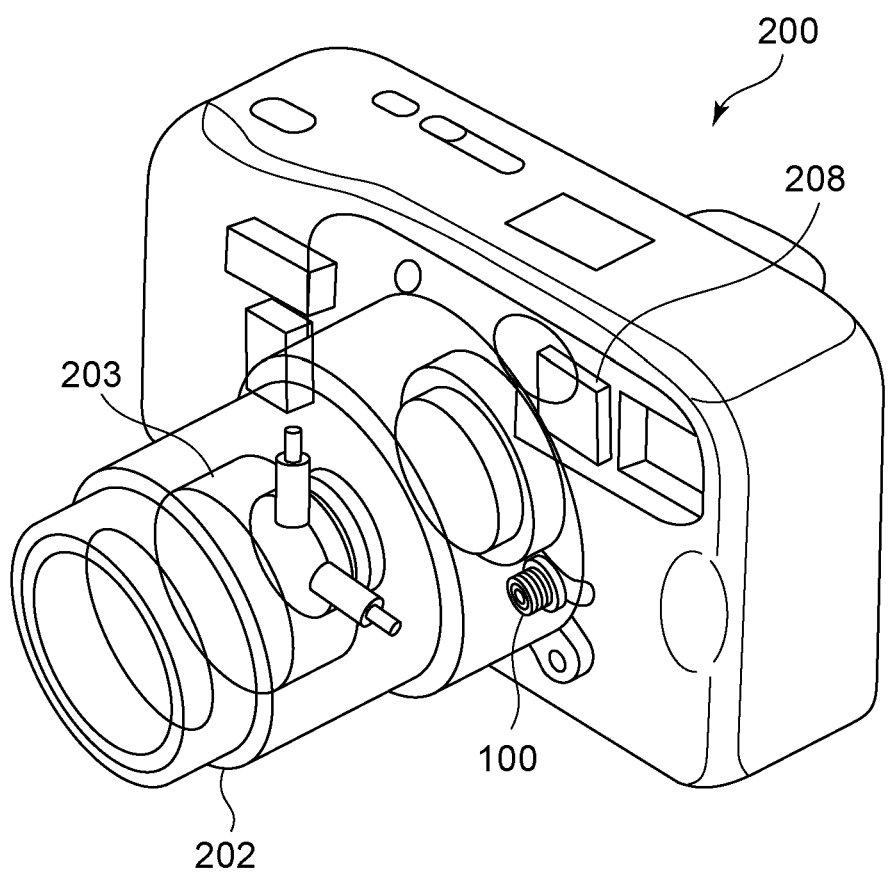
FIG. 5 is a cross-sectional view of the outline structure illustrating one embodiment of an optical device.

FIG. 5 is a perspective diagram illustrating the outline structure of a digital camera (imaging device) 200 which is an example of the optical device.

A lens barrel 202 is attached to the front surface of the digital camera 200 and a lens and a hand shake correction optical system 203 are disposed inside the lens barrel 202.

On the body side of the digital camera 200, an image pickup device 208 is disposed, and light passing through the lens barrel 202 forms an image as an optical image in the image pickup device 208. The image pickup device 208 is a photoelectric conversion device, such as a CMOS sensor or a CCD sensor, and converts an optical image into an analog electric signal. The analog electric signal output from the image pickup device 208 is converted into a digital signal by an A/D converter which is not illustrated, and then stored in a storage medium, such as a semiconductor memory which is not illustrated, as image data (video data) through predetermined image processing by an image processing circuit which is not illustrated.

In the lens barrel 202, a lens group which is not illustrated and is movable in the optical axis direction is disposed. The vibration wave motor 100 is dynamically connected to an optical member, such as the lens barrel 202, through a gear train which is not illustrated or the like to drive the lens group disposed in the lens barrel 202. The vibration wave motor 100 can be used for the drive of a zoom lens, the drive of a focusing lens, and the like in the digital camera 200.

Herein, the digital camera is described as the optical device. In addition thereto, the present disclosure is applicable to an optical device having a vibration wave motor in an actuator irrespective of the kind of cameras, such as an interchangeable lens barrel of a single-lens reflex camera, a compact camera, an electronic still camera, and a portable information terminal with a camera.

Electronic Device of Present Disclosure

An electronic device has an electronic part and the piezoelectric element 10 as a driving source.

Figure 6A:
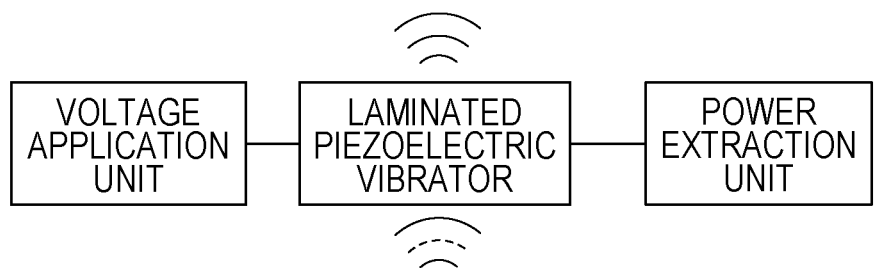
FIGS. 6A to 6C are conceptual diagrams illustrating one embodiment of an electronic device.
Figure 6B:
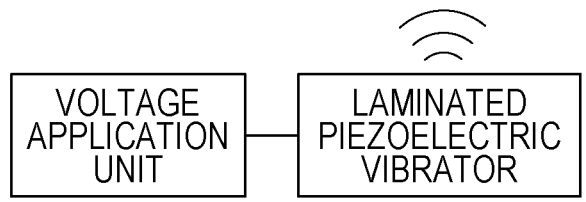
Figure 6C:
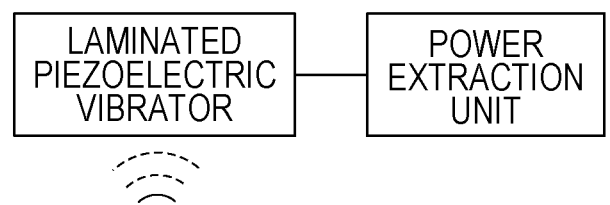

FIGS. 6A to 6C are schematic views illustrating one embodiment of the electronic device.

The laminated piezoelectric vibrator is usable for electronic devices, such as a liquid discharge head, a vibrating device, a piezoelectric sound collecting device, a piezoelectric sound generation device, a piezoelectric actuator, a piezoelectric sensor, a piezoelectric transformer, a ferroelectric memory, and a power generation device.

As illustrated in FIGS. 6A to 6C, the electronic device has the laminated piezoelectric vibrator and has at least one of a voltage application unit and a power extraction unit to/from the laminated piezoelectric vibrator. The "power extraction" may be either the action of extracting electric energy or the action of receiving an electric signal. The electronic device utilizes the vibrator vibration generated by the voltage application unit for the function. Alternately, the electronic device detects the power generated in a laminated vibrator vibrating by external action with the power extraction unit, and utilizes the power for the function.

EXAMPLES

The present disclosure is more specifically described with reference to Examples but the present invention is not limited by Examples described below.

Example 1

First, a powdered barium titanate-based material serving as a starting material of a piezoelectric material layer was prepared.

Specifically, barium carbonate ($BaCO_3$), calcium carbonate ($CaCO_3$), titanium oxide ($TiO_2$), zirconium oxide ($ZrO_2$), and trimangantetraoxid ($Mn_3O_4$) were weighed in such a manner that an x value which is a molar ratio of Ba to the total of Ba and Ca was 0.13, a y value which is a molar ratio of Zr to the total of Ti and Zr was 0.03, and the Mn content was 0.30 part by weight in terms of metal based on 100 parts by weight of an oxide containing Ba, Ca, Ti, and Zr, followed by mixing. The mixed powder was calcined at 900° C. for 4 hours to give calcined powder containing the barium titanate-based material.

To 100 parts by weight of the calcined powder, 0.1 part by weight of an assistant was added. For the assistant, a mixture of particulate $SiO_2$, $B_2O_3$, $Al_2O_3$, and $Na_2CO_3$ having an average particle diameter of 1.0 μm was used. The weight ratio of $SiO_2$, $B_2O_3$, $Al_2O_3$, and $Na_2CO_3$ contained in the assistant was set to 5 to 2 to 2 to 1 as an anhydride.

Next, the calcined powder with which the assistant was mixed and 3 parts by weight of a binder (PVB) based on 100 parts by weight of the calcined powder were added to and mixed with water as a solvent to give slurry.

A 60 µm thick green sheet was obtained by a doctor blade method using the obtained slurry.

A conductive paste for internal metal electrodes was printed to the green sheet described above. For the conductive paste, an Ag60%-Pd40% alloy (Ag/Pd=1.50) paste was used. 36 green sheets to which the conductive paste was applied were laminated, and then fired so as to hold the laminate at the highest temperature of 1250° C. for 5 hours to give a sintered body.

The composition of a piezoelectric material portion of the sintered body thus obtained was evaluated by ICP optical emission spectroscopy. As a result, it was found that an oxide which can be expressed by the chemical formula of $(Ba_{0.87}Ca_{0.13})(Ti_{0.97}Zr_{0.03})O_3$ was the main component and 0.30 part by weight of Mn was contained based on 100 parts by weight of the main component. With respect to the components of Ba, Ca, Ti, Zr, and Mn, the weighed compositions and the compositions as the piezoelectric material after sintering coincide with each other.

The thickness in the lamination direction of the sintered body was 2.0 mm.

The sintered body was cut out into a cylindrical shape having an outer diameter of 6 mm, and then a through-hole having an inner diameter of 2 mm was formed in a central portion of the circular surface by a cutting process. A pair of metal electrodes (first electrode and second electrode) alternately short-circuiting internal electrode layers was formed on the outer surface of the cylindrical element by an Au sputtering method to produce a piezoelectric element as illustrated in FIG. 1C. Next, the laminated sintered body was subjected to a poling procedure to obtain a piezoelectric element. Specifically, a sample was heated to 135° C. on a hot plate, a 14 kV/cm electric field was applied between the first electrode and the second electrode for 30 minutes, and then the sample was cooled to room temperature while applying the electric field.

When a lead component contained in the piezoelectric element was evaluated by ICP optical emission spectroscopy, it was found that about 2 ppm of the lead component is contained in the piezoelectric element. The lead component contained in the piezoelectric material layer portion was also about 2 ppm.

When the cross section along vertical plane of the piezoelectric element was observed under a 25× magnification power microscope, 36 piezoelectric material layers and 35 electrode layers were alternately laminated. The layer thickness $T_P$ of the piezoelectric material layer was 55 µm in all the piezoelectric material layers. The layer thickness $T_E$ of the electrode layer was 6 µm in all the electrode layers.

Figure 7:
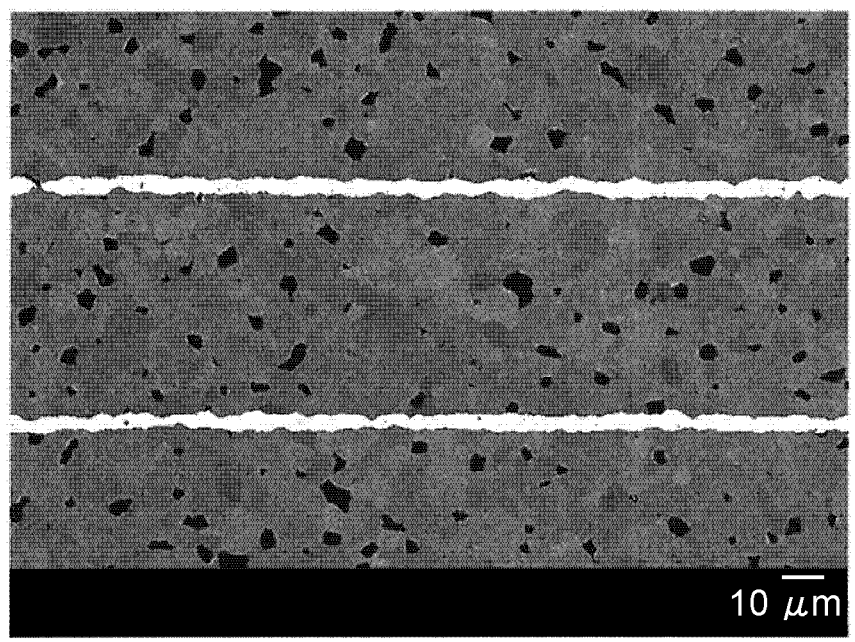
FIG. 7 is a view illustrating the cross-sectional structure of a piezoelectric element of Examples.

Furthermore, the cross section along vertical plane of the piezoelectric element was observed at a magnification as high as 400 using a scanning electron microscope. FIG. 7 illustrates a reflected electron image of the cross section along vertical plane of the piezoelectric element of Example 1. In FIG. 7, white portions with high luminosity are the electrode layers and colored portions with low luminosity sandwiched between the plurality of electrode layers are the piezoelectric material layers. Black portions inside the piezoelectric material layers are void portions and neutral color parts are aggregates of crystal particles. In the metal oxide, the reflection electron luminosity varies in each particle. A black belt portion of the lower portion of the figure is an artificially colored portion for giving a scale bar and does not relate to the structure of the piezoelectric element.

The three piezoelectric material layers observed in FIG. 7 all contained the plurality of crystal particles and aggregates of the plurality of void portions.

Herein, the second piezoelectric material layer from the bottom of FIG. 7 is noted. With respect to the piezoelectric material layer, when five reflected electron images of the same magnification observed at different places were obtained, and then the average thickness $T_P$ in the lamination direction of the piezoelectric material layers and the average thickness $T_E$ of the electrode layers contacting the piezoelectric material layers were calculated from the observation images, the $T_P$ was 55 µm and the $T_E$ was 6.0 µm. Next, when the average circle-equivalent diameter $D_G$ of the crystal particles was calculated from the same observation image for the piezoelectric material layers, the $D_G$ was 8.5 µm which was at least 0.07 times larger than the $T_P$ and at least 0.33 times smaller than the $T_P$.

Furthermore, when the entire cross-sectional region of the piezoelectric material layers was observed, and then the maximum length $L_V$ in the lamination direction of the void portion present in a portion surrounded by the crystal particles without contacting the electrode layers is determined, the $L_V$ was 10 µm which was larger than the $T_E$ and was at least 0.3 times smaller than the $T_P$.

When the line average roughness Ra of the interfaces between the noted piezoelectric material layer and the electrode layers adjacent thereto was calculated from the same observation image, the Ra was 0.42 µm as the average value of two interfaces.

The ratio $P_V$ in which the total cross-sectional area of the void portions occupy the cross-sectional area of the piezoelectric material layer was 6.2% by area from the same observation image.

When the apparent piezoelectric constant $d_{33}^{*sum}$ of the entire piezoelectric element obtained in this example was measured at room temperature by a $d_{33}$ meter, and then the measured value $d_{33}^{*sum}$ was divided by 36 which was the number of the layers, the piezoelectric constant $d_{33}$ was 200 pm/V. Simultaneously, the dielectric loss tangent obtained by the $d_{33}$ meter was 0.5% at 160 Hz.

Subsequently, a laminated piezoelectric vibrator was produced using the obtained piezoelectric element.

First, the piezoelectric element was subjected to primer treatment to be bonded under pressure to an SUS first elastic body. Subsequently, electric wiring containing a flexible printed circuit board was sandwiched between a surface to which the first elastic body is not bonded of the piezoelectric element and an SUS second elastic body. Finally, an SUS shaft was caused to penetrate the piezoelectric element, the first elastic body, and the second elastic body, and then fastened under pressure with an SUS first nut to obtain a laminated piezoelectric vibrator.

Examples 2 to 7

Piezoelectric elements of the present disclosure were obtained in the same manner as in Example 1, except changing the raw material mixing ratio, the green sheet thickness, the Ag/Pd ratio of the conductive paste, and the highest firing temperature of the laminate.

When the composition of the piezoelectric material portion was evaluated by ICP optical emission spectroscopy, the weighed compositions of the components of Ba, Ca, Ti, Zr, and Mn and the compositions after sintering coincide with each other in all the piezoelectric elements. The lead components contained in the piezoelectric elements and the piezoelectric material layers were less than 10 ppm in all the piezoelectric elements. The manufacturing conditions of the piezoelectric elements are given in Table 1.

The $T_P$, the $T_E$, the $D_G$, the $L_V$, the Ra, the $d_{33}$, and the dielectric loss tangent of the piezoelectric elements were measured in the same manner as in Example 1. The measurement results of the parameters are given in Table 2. The $P_V$ determined in the same manner as in Example 1 was within the range of 3 to 10% by area.

Next, laminated piezoelectric vibrators using the piezoelectric elements of Examples 2 to 7 were produced in the same manner as in Example 1.

Example 8

A piezoelectric element was obtained in the same manner as in Example 1, except adding 0.1 part by weight in terms of solid content of hollow silica particles in the form of an IPA dispersion liquid based on 100 parts by weight of calcined powder in addition to the mixture of $SiO_2$, $B_2O_3$, $Al_2O_3$, and $Na_2CO_3$ as the assistant to the calcined powder.

When the composition of a piezoelectric material portion was evaluated by ICP optical emission spectroscopy, the weighed compositions of the components of Ba, Ca, Ti, Zr, and Mn and the compositions after sintering coincide with each other. The lead components contained in the piezoelectric element and the piezoelectric material layer were about 3 ppm.

The $T_P$, the $T_E$, the $D_G$, the $L_V$, the Ra, the $d_{33}$, and the dielectric loss tangent of the piezoelectric element were measured in the same manner as in Example 1. The measurement results of the parameters are given in Table 2. The $P_V$ determined in the same manner as in Example 1 was within the range of 9.0% by area.

Next, a laminated piezoelectric vibrator using the piezoelectric element of Example 8 was produced in the same manner as in Example 1.

Comparative Example 1

A comparative piezoelectric element was obtained in the same manner as in Example 1, except changing the Ag/Pd ratio of the conductive paste to 4:6 from 6:4 and the highest firing temperature of the laminate to 1400° C. from 1250° C.

When the composition of a piezoelectric material portion was evaluated by ICP optical emission spectroscopy, the weighed compositions of the components of Ba, Ca, Ti, Zr, and Mn and the compositions after sintering coincide with each other. The manufacturing conditions of the piezoelectric element are given in Table 1.

The $T_P$, the $T_E$, the $D_G$, the $L_V$, the Ra, the $d_{33}$, and the dielectric loss tangent of the piezoelectric element were measured in the same manner as in Example 1. As a result, the $T_P$ was 55 μm, the $D_G$ was 20.1 μm, the $L_V$ was 19.0 μm, and the $T_E$ was 6.0 μm. More specifically, the $D_G$ was 0.36 times the $T_P$ and the $L_V$ was larger than the $T_E$ and 0.35 times the $T_P$. The measurement results of the parameters are given in Table 2. The $P_V$ calculated in the same manner as in Example 1 was 13.7% by area.

Next, a laminated piezoelectric vibrator using the piezoelectric element of Comparative Example 1 was produced in the same manner as in Example 1.

Comparative Example 2

A comparative piezoelectric element was obtained in the same manner as in Example 1, except changing the green sheet thickness, the Ag/Pd ratio of the conductive paste, and the highest firing temperature of the laminate and increasing the addition amount of the assistant so that the amount of the assistant was 1.0 part by weight based on 100 parts by weight of calcined powder.

When the composition of a piezoelectric material portion was evaluated by ICP optical emission spectroscopy, the weighed compositions of the components of Ba, Ca, Ti, Zr, and Mn and the compositions after sintering coincide with each other. The manufacturing conditions of the piezoelectric element are given in Table 1.

The $T_P$, the $T_E$, the $D_G$, the $L_V$, the Ra, the $d_{33}$, and the dielectric loss tangent of the piezoelectric element were measured in the same manner as in Example 1. As a result, the $T_P$ was 30 μm, the $D_G$ was 12.3 μm, the $L_V$ was 10 μm, and the $T_E$ was 6 μm. More specifically, the $D_G$ was 0.40 times the $T_P$ and the $L_V$ was larger than then the $T_E$ and 0.33 times the $T_P$. The measurement results of the parameters are given in Table 2. The $P_V$ calculated in the same manner as in Example 1 was 10.4% by area.

Next, a laminated piezoelectric vibrator using the piezoelectric element of Comparative Example 2 was produced in the same manner as in Example 1.

Comparative Example 3

A comparative piezoelectric element was obtained in the same manner as in Example 1, except changing the green sheet thickness, the Ag/Pd ratio of the conductive paste, and the highest firing temperature of the laminate.

When the composition of a piezoelectric material portion was evaluated by ICP optical emission spectroscopy, the weighed compositions of the components of Ba, Ca, Ti, Zr, and Mn and the compositions after sintering coincide with each other. The manufacturing conditions of the piezoelectric element are given in Table 1.

The $T_P$, the $T_E$, the $D_G$, the $L_V$, the Ra, the $d_{33}$, and the dielectric loss tangent of the piezoelectric element were measured in the same manner as in Example 1. As a result, the $T_P$ was 45 μm, the $D_G$ was 1.9 μm, the $L_V$ was 1.2 μm, and the $T_E$ was 6.0 μm. More specifically, the $D_G$ was 0.04 times the $T_P$ and the $L_V$ was smaller than the $T_E$. The measurement results of the parameters are given in Table 2. The $P_V$ calculated in the same manner as in Example 1 was 2.8% by area.

Next, a laminated piezoelectric vibrator using the piezoelectric element of Comparative Example 3 was produced in the same manner as in Example 1.

Comparative Example 4

A comparative piezoelectric element was obtained in the same manner as in Example 1, except changing the Ag/Pd ratio of the conductive paste and the highest firing temperature of the laminate and setting the component ratio of the assistant to 7 to 3 to 0 to 0 in terms of weight ratio of $SiO_2$, $B_2O_3$, $Al_2O_3$, and $Na_2CO_3$.

When the composition of a piezoelectric material portion was evaluated by ICP optical emission spectroscopy, the weighed compositions of the components of Ba, Ca, Ti, Zr, and Mn and the compositions after sintering coincide with each other. The manufacturing conditions of the piezoelectric element are given in Table 1.

The $T_P$, the $T_E$, the $D_G$, the $L_V$, the Ra, the $d_{33}$, and the dielectric loss tangent of the piezoelectric element were measured in the same manner as in Example 1. As a result, the $T_P$ was 55 μm, the $D_G$ was 10.0 μm, the $L_V$ was 0.8 μm, and the $T_E$ was 6.0 μm. More specifically, the $D_G$ was 0.18 times the $T_P$ and the $L_V$ was smaller than the $T_E$. The measurement results of the parameters are given in Table 2. The $P_V$ calculated in the same manner as in Example 1 was 1.1% by area.

Next, a laminated piezoelectric vibrator using the piezoelectric element of Comparative Example 4 was produced in the same manner as in Example 1.

Examples 1 to 4, and then the distortion rate was measured with a laser displacement meter. The distortion rate as used herein is the percentage obtained by multiplying a value, which was obtained by dividing the measured distortion amount by the thickness of a laminated portion, by 100.

While the vibrator distortion rates of Examples 1 to 8 are all within the range of 0.10% or more and 0.15% or less, the

TABLE 1

| | Composition of piezoelectric material layer | Green sheet thickness | Composition of metal electrode layer | Highest firing temperature |
|---|---|---|---|---|
| Ex. 1 | $(Ba_{0.87}Ca_{0.13})(Ti_{0.97}Zr_{0.03})O_3$-Mn0.30 | 60 μm | Ag:Pd = 6:4 | 1250° C. |
| Ex. 2 | $(Ba_{0.87}Ca_{0.13})(Ti_{0.97}Zr_{0.03})O_3$-Mn0.20 | 35 μm | Ag:Pd = 6:4 | 1250° C. |
| Ex. 3 | $(Ba_{0.80}Ca_{0.20})(Ti_{0.93}Zr_{0.07})O_3$-Mn0.30 | 40 μm | Ag:Pd = 6:4 | 1250° C. |
| Ex. 4 | $(Ba_{0.90}Ca_{0.10})(Ti_{0.98}Zr_{0.02})O_3$-Mn0.10 | 22 μm | Ag:Pd = 7:3 | 1200° C. |
| Ex. 5 | $(Ba_{0.90}Ca_{0.10})(Ti_{0.93}Zr_{0.07})O_3$-Mn0.40 | 80 μm | Ag:Pd = 7:3 | 1200° C. |
| Ex. 6 | $(Ba_{0.87}Ca_{0.13})(Ti_{0.95}Zr_{0.05})O_3$-Mn0.30 | 80 μm | Ag:Pd = 5:5 | 1350° C. |
| Ex. 7 | $(Ba_{0.87}Ca_{0.13})(Ti_{0.97}Zr_{0.03})O_3$-Mn0.30 | 50 μm | Ag:Pd = 5:5 | 1300° C. |
| Ex. 8 | $(Ba_{0.87}Ca_{0.13})(Ti_{0.97}Zr_{0.03})O_3$-Mn0.30 | 60 μm | Ag:Pd = 6:4 | 1250° C. |
| Comp. Ex. 1 | $(Ba_{0.87}Ca_{0.13})(Ti_{0.97}Zr_{0.03})O_3$-Mn0.30 | 60 μm | Ag:Pd = 4:6 | 1400° C. |
| Comp. Ex. 2 | $(Ba_{0.87}Ca_{0.13})(Ti_{0.97}Zr_{0.03})O_3$-Mn0.30 | 35 μm | Ag:Pd = 5:5 | 1300° C. |
| Comp. Ex. 3 | $(Ba_{0.87}Ca_{0.13})(Ti_{0.97}Zr_{0.03})O_3$-Mn0.30 | 50 μm | Ag:Pd = 7:3 | 1100° C. |
| Comp. Ex. 4 | $(Ba_{0.87}Ca_{0.13})(Ti_{0.97}Zr_{0.03})O_3$-Mn0.30 | 60 μm | Ag:Pd = 5:5 | 1360° C. | vibrator distortion rates of Comparative Examples 1, 2, and

TABLE 2

| | $T_P$ [μm] | $0.07 \times T_P$ [μm] | $D_G$ [μm] | $0.33 \times T_P$ [μm] | $T_E$ [μm] | $L_V$ [μm] | $0.3 \times T_P$ [μm] | Ra [μm] | $P_V$ [% by area] | $d_{33}$ [pC/N] | Dielectric loss tangent [—] |
|---|---|---|---|---|---|---|---|---|---|---|---|
| Ex. 1 | 55 | 3.9 | 8.5 | 18.2 | 6.0 | 10.0 | 16.5 | 0.42 | 6.2 | 200 | 0.5% |
| Ex. 2 | 30 | 2.1 | 9.9 | 9.9 | 6.0 | 7.5 | 9.0 | 0.77 | 5.3 | 210 | 0.7% |
| Ex. 3 | 35 | 2.5 | 6.1 | 11.6 | 6.0 | 6.0 | 10.5 | 0.35 | 6.6 | 250 | 0.8% |
| Ex. 4 | 20 | 1.4 | 5.1 | 6.6 | 3.5 | 5.0 | 6.0 | 0.29 | 8.9 | 170 | 0.7% |
| Ex. 5 | 70 | 4.9 | 5.2 | 23.1 | 3.5 | 5.5 | 21.0 | 0.26 | 9.5 | 240 | 0.7% |
| Ex. 6 | 70 | 4.9 | 15.0 | 23.1 | 10.0 | 20.0 | 21.0 | 0.65 | 3.1 | 240 | 0.5% |
| Ex. 7 | 45 | 3.2 | 13.5 | 14.9 | 6.0 | 9.0 | 13.5 | 1.00 | 5.5 | 230 | 0.7% |
| Ex. 8 | 55 | 3.9 | 8.5 | 18.2 | 6.0 | 15.0 | 16.5 | 0.28 | 9.0 | 190 | 0.5% |
| Comp. Ex. 1 | 55 | 3.9 | 20.1 | 18.2 | 6.0 | 19.0 | 16.5 | 2.44 | 13.7 | 150 | 2.1% |
| Comp. Ex. 2 | 30 | 2.1 | 12.3 | 9.9 | 6.0 | 10.0 | 9.0 | 1.68 | 10.4 | 120 | 2.3% |
| Comp. Ex. 3 | 45 | 3.2 | 1.9 | 14.9 | 6.0 | 1.2 | 13.5 | 0.68 | 2.8 | 90 | 0.7% |
| Comp. Ex. 4 | 55 | 3.9 | 10.0 | 18.2 | 6.0 | 0.8 | 16.5 | 7.25 | 1.1 | 150 | 4.6% |

Figure 8A:
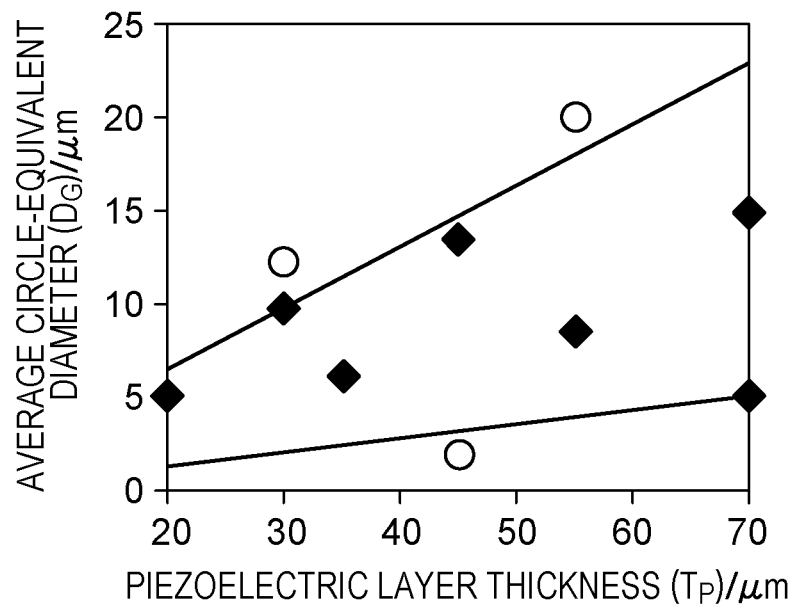
FIGS. 8A and 8B are correlation diagrams illustrating features of piezoelectric elements of Examples and Comparative Examples.
Figure 8B:
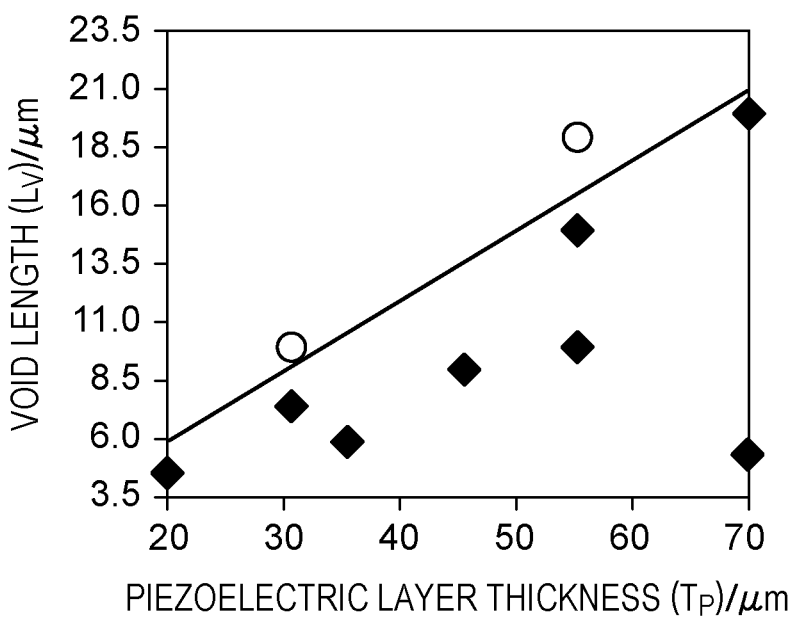

FIGS. 8A and 8B illustrate the relationship between the $T_P$ value and the $D_G$ value and the relationship between the $T_P$ value and the $L_V$ value, respectively, of the piezoelectric elements of Examples 1 to 8 and the piezoelectric elements of Comparative Examples 1 to 4. ♦ marks plot the values of Examples and ○ marks plot the values of Comparative Examples. The axis of abscissae of FIG. 8A represents the $T_P$, the axis of ordinates represents the $D_G$, the solid line represents the range of $0.07T_P \leq D_G \leq 0.33T_P$, and the dotted line represents the range of 5 μm ≤ $D_G$ ≤ 15 μm in a supplementary manner.

On the other hand, the axis of abscissae of FIG. 8B represents the $T_P$, the axis of ordinates represents the $L_V$, and the solid line represents the range of $L_V \leq 0.3T_P$ in a supplementary manner.

Vibrator Displacement

A 3 kV/mm DC electric field was applied to the laminated piezoelectric vibrators of Examples 1 to 8 and Comparative 4 were as low as about 0.08%. Particularly the vibrator distortion rate of Comparative Example 3 was as low as about 0.04%.

Production of Vibration Wave Motor

To the laminated piezoelectric vibrators of Examples 1 to 8 and Comparative Examples 1 to 4, a movable body containing a rubber sliding member, an SUS rotor, an SUS pressurization spring, and an SUS gear, an SUS flange, and an SUS second nut were attached to produce a vibration wave motor of the structure illustrated in FIG. 4.

A 15 Vrms alternating voltage was applied to the produced vibration wave motor to rotationally drive the vibration wave motor. For the vibration wave motor in which the rotational speed reached 700 rpm by bringing the frequency of the applied voltage close to the resonance frequency, the power consumption of a motor portion was measured with a wattmeter. The measurement results are given in Table 3.

TABLE 3

| | Power consumption at 700 rpm [W] |
|---|---|
| Ex. 1 | 1.3 |
| Ex. 2 | 1.4 |
| Ex. 3 | 1.4 |
| Ex. 4 | 1.7 |
| Ex. 5 | 1.5 |
| Ex. 6 | 1.3 |
| Ex. 7 | 1.5 |
| Ex. 8 | 1.4 |
| Comp. Ex. 1 | 2.3 |
| Comp. Ex. 2 | 2.4 |
| Comp. Ex. 3 | Not reach 700 rpm |
| Comp. Ex. 4 | 3.1 |

As given in Table 3, while the power consumption of the motors at 700 rpm of all the vibration wave motors of Examples was 1.7 W or less, the power consumption under the same conditions of Comparative Examples 1, 2, and 4 was 2.3 W or more. Moreover, in the vibration wave motor of Comparative Example 3, the highest rotational speed in the voltage application did not reach 700 rpm.

As illustrated in FIG. 8A, an excellent effect is exhibited due to the fact that the average circle-equivalent diameter $D_G$ falls within a suitable range with respect to the thickness $T_P$ in the lamination direction of the piezoelectric material layers. In addition, as illustrated in FIG. 8B, an excellent effect is exhibited due to the fact that the maximum length in the lamination direction of the void portion falls within a suitable range similarly with respect to the $T_P$. According to Examples and Comparative Examples given in Table 2, Examples satisfying the above-described conditions exhibited good values of a piezoelectric constant $d_{33}$ of 170 pC/N or more, which was 10% or more higher than the values of Comparative Examples. As is understood from Table 3, the power consumption of each of Examples exhibited good values of 1.7 W or less, which was 20% or more lower than the values of Comparative Examples.

Number of Piezoelectric Material Layers

The number of the piezoelectric material layers in the piezoelectric elements, the laminated piezoelectric vibrators, and the vibration wave motors of Examples 1 to 8 was 36 layers but, even when the number of layers were varied in the range of 2 to 60 layers, the piezoelectric elements, the laminated piezoelectric vibrators, and the vibration wave motors were able to be similarly produced. Particularly in a vibration wave motor having the number of layers of 25 or more and 55 or less was able to be driven at 700 rpm with the power consumption of the motor close to that given in Table 3.

Optical Device

The vibration wave motors of Examples 1 to 8 and Comparative Examples 1, 2, and 4 and a lens barrel which is an optical member were dynamically connected to produce optical devices as illustrated in FIG. 5. In all the optical devices, an autofocusing operation according to the application of an alternating voltage was able to be confirmed. However, the power consumption in the focusing operation of the optical devices of Examples was 20% or more lower than that in the focusing operation of the optical devices of Comparative Examples.

Electronic Device

Figure 9:
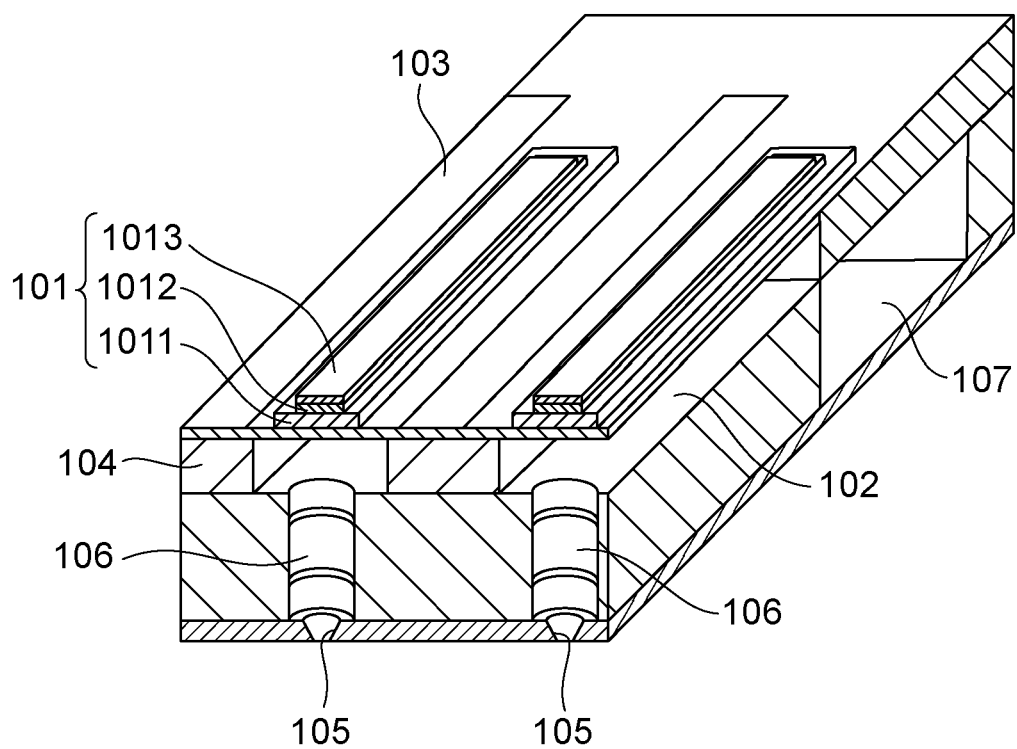
FIG. 9 is a schematic view illustrating the structure of a liquid discharge head as an Example of an electronic device.

Liquid discharge heads illustrated in FIG. 9 were produced using the piezoelectric elements of Examples 1 to 8. The liquid discharge head illustrated in FIG. 9 has the piezoelectric element 101 (containing an electrode 1011, a laminated portion 1012, and an electrode 1013) of Examples. Furthermore, the liquid discharge head has discharge ports 105, individual liquid chambers 102, communication holes 106 connecting the individual liquid chambers 102 and the discharge ports 105, liquid chamber partitions 104, a common liquid chamber 107, diaphragms 103, and piezoelectric elements 101. A liquid ink can be stored in the liquid chambers.

When an electric signal is input into the liquid discharge heads, the discharge of ink following a signal pattern was confirmed. The liquid discharge heads were installed in an ink-jet printer, and then the ink discharge to a recording paper was confirmed.

INDUSTRIAL APPLICABILITY

The present disclosure can provide a piezoelectric element having highly efficient driving characteristics. Moreover, the present disclosure can provide a vibrator, a vibration wave motor, an optical device, and an electronic device having highly efficient driving characteristics. Furthermore, the piezoelectric element is applicable to general piezoelectric devices containing laminated elements.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-107059 filed May 30, 2017 and No. 2018-089410 filed May 7, 2018, which are hereby incorporated by reference herein in their entirety.

What is claimed is:

1. A piezoelectric element comprising:
   electrode layers; and
   a piezoelectric material layer sandwiched between the electrode layers,
   wherein
   the piezoelectric material layer and the electrode layers are alternately laminated,
   wherein
   the piezoelectric material layer has a plurality of crystal particles and a plurality of void portions, and
   the following formulas are satisfied:

$$0.07T_P \leq D_G \leq 0.33T_P \text{ and}$$

$$T_E \leq L_V \leq 0.3T_P$$

where $T_P$ is an average thickness in a lamination direction of the piezoelectric material layer, $D_G$ is an average circle-equivalent diameter of the plurality of crystal particles, $L_V$ is a maximum length in a lamination direction of the plurality of void portions not contacting the electrode layers, and $T_E$ is an average thickness of the electrode layers contacting the piezoelectric material layer, and
   a lead content is less than 1000 ppm.

2. The piezoelectric element according to claim 1, wherein
   the average circle-equivalent diameter $D_G$ is 5 μm or more and 15 μm or less.

3. The piezoelectric element according to claim 1, wherein
   a line average roughness Ra of an interface of the electrode layers contacting the piezoelectric material layer is 1 μm or less when observed from a cross section in the lamination direction.

4. The piezoelectric element according to claim 1, wherein
the average thickness $T_P$ in the lamination direction of the piezoelectric material layer is 20 μm or more and 70 μm or less.

5. The piezoelectric element according to claim 1, wherein
the average thickness $T_E$ of the electrode layers contacting the piezoelectric material layer is 3.5 μm or more and 10 μm or less.

6. The piezoelectric element according to claim 1, wherein
the piezoelectric material layer contains an oxide of titanium and barium.

7. The piezoelectric element according to claim 6, wherein
the oxide of the titanium and the barium contains Ba, Ca, Ti, and Zr.

8. The piezoelectric element according to claim 7, wherein
the piezoelectric material layer satisfies $0.02 \leq x \leq 0.30$ and $0.01 \leq y \leq 0.09$, where x is a molar ratio of the Ca to a total of the Ba and the Ca, y is a molar ratio of the Zr to a total of the Ti and the Zr, and Mn is contained in a proportion of 0.02 part by weight or more and 0.40 part by weight or less in terms of metal based on 100 parts by weight of the oxide.

9. A vibrator comprising:
the piezoelectric element according to claim 1; and
a first elastic body and a second elastic body holding the piezoelectric element between the first elastic body and the second elastic body.

10. A vibration wave motor comprising:
the vibrator according to claim 9; and
a movable body contacting the vibrator.

11. An optical device comprising:
the vibration wave motor according to claim 10; and
an optical member movably held by the vibration wave motor.

12. An electronic device comprising:
an electronic part; and
the piezoelectric element according to claim 1.

* * * * *